US 6,633,057 B2

(12) United States Patent
Kawata et al.

(10) Patent No.: US 6,633,057 B2
(45) Date of Patent: Oct. 14, 2003

(54) NON-VOLATILE SEMICONDUCTOR MEMORY AND FABRICATING METHOD THEREFOR

(75) Inventors: Masato Kawata, Tokyo (JP); Kuniko Kikuta, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 56 days.

(21) Appl. No.: 09/815,060

(22) Filed: Mar. 23, 2001

(65) Prior Publication Data

US 2001/0019867 A1 Sep. 6, 2001

Related U.S. Application Data

(62) Division of application No. 09/399,155, filed on Sep. 20, 1999, now Pat. No. 6,235,583.

(30) Foreign Application Priority Data

Sep. 18, 1998 (JP) ............................................ 10-263834

(51) Int. Cl.[7] .................. H01L 27/10; H01L 29/76; H01L 27/108; H01L 21/8238; H01L 21/8234
(52) U.S. Cl. ...................... 257/211; 257/314; 257/324; 257/350; 257/296; 257/776; 438/201; 438/275
(58) Field of Search ................................. 257/314, 315, 257/316, 317, 318, 319, 320, 321, 322, 323, 324, 776, 211, 350, 296; 438/201, 275, 258

(56) References Cited

U.S. PATENT DOCUMENTS 5,153,143 A * 10/1992 Schlais et al. .............. 438/201
5,257,095 A * 10/1993 Liu et al. .................... 257/315
6,020,229 A * 2/2000 Yamane et al. ............. 438/201
6,054,734 A * 4/2000 Aozasa et al. .............. 257/315
6,268,278 B1 * 7/2001 Eimori et al. ............... 438/624

FOREIGN PATENT DOCUMENTS

| JP | 63186478 | 8/1988 |
| JP | 3248462 | 11/1991 |
| JP | 4229654 | 8/1992 |
| JP | 563206 | 3/1993 |
| JP | 661458 | 3/1994 |
| JP | 8321590 | 12/1996 |
| JP | 9121028 | 5/1997 |
| JP | 10107229 | 4/1998 |

* cited by examiner

Primary Examiner—Caridad Everhart
Assistant Examiner—Chuong Anh Luu
(74) Attorney, Agent, or Firm—Young & Thompson

(57) ABSTRACT

In a non-volatile semiconductor memory having a peripheral circuit zone and a memory zone including plural memory cells each having a floating gate and a control gate, an interlayer insulator is formed over the control gate of the memory cells and a gate electrode in the peripheral circuit zone. A groove is formed in the interlayer insulator film to longitudinally extend along a word line which constitutes the control gate for a plurality of memory cells arranged in one line. This groove penetrates through the interlayer insulator film to reach the word line over the whole length of the word line. A conducting material is deposited on the interlayer insulator film to fill up the groove so that a plate-shaped contact is formed in the groove. The conducting material is patterned to form an overlying interconnection extending on the interlayer insulator film along the word line.

8 Claims, 12 Drawing Sheets

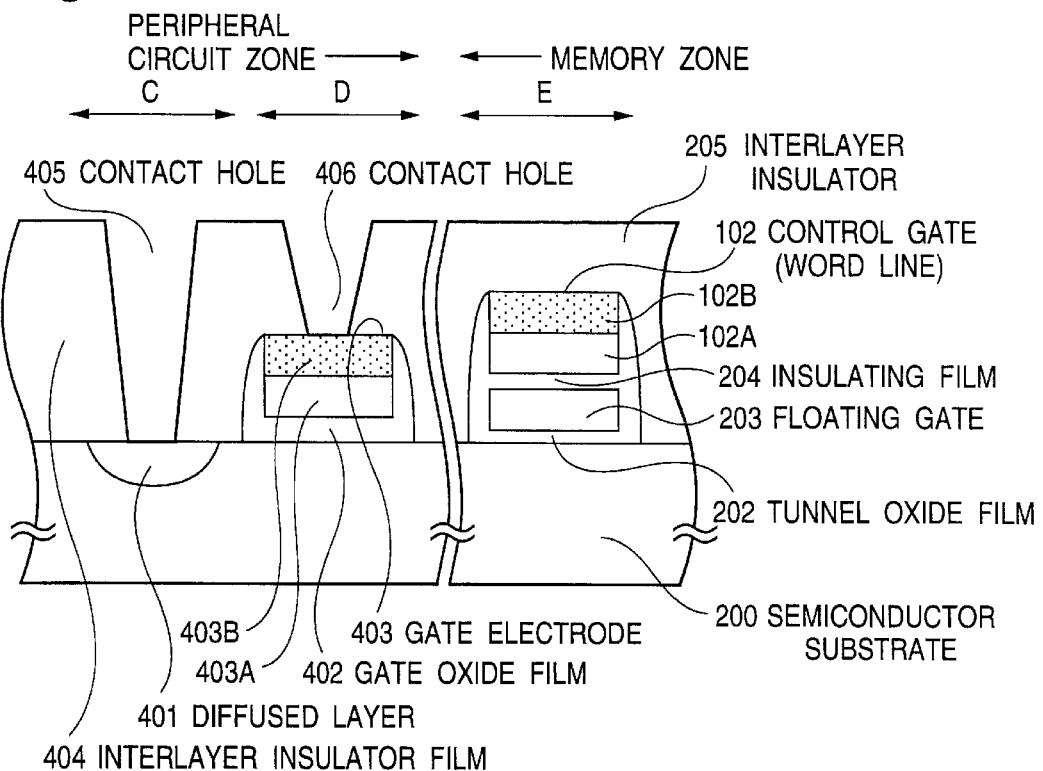
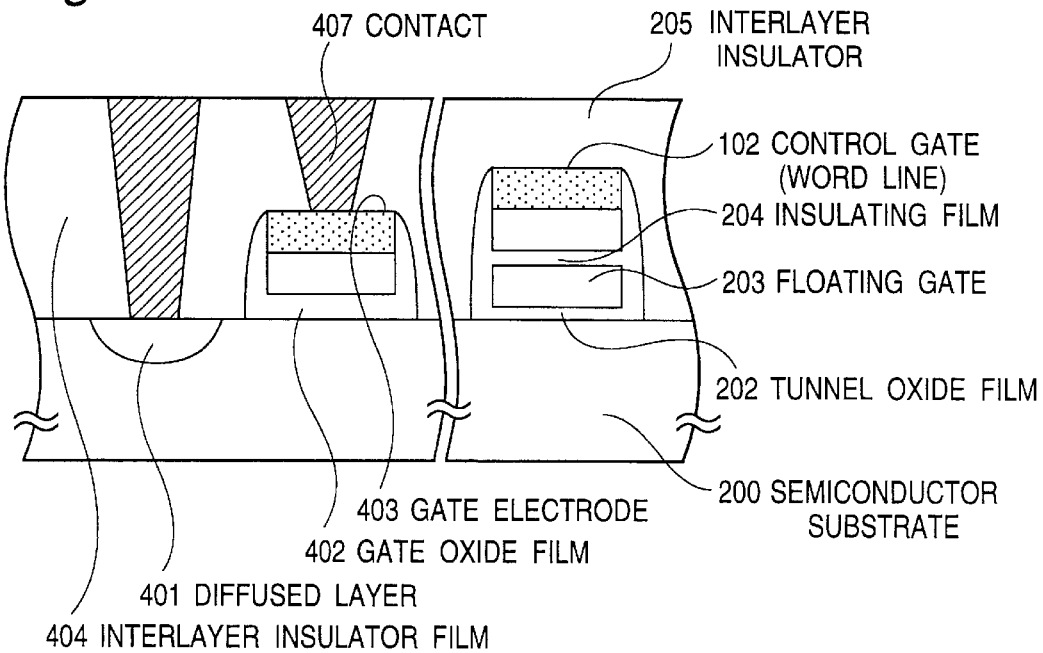

NON-VOLATILE SEMICONDUCTOR MEMORY AND FABRICATING METHOD THEREFOR

RELATED APPLICATION

This application is a division of application Ser. No. 09/399,155, filed on Sep. 20, 1999, now U.S. Pat. No. 6,235,583 the entire contents of which are hereby incorporated by reference.

BACKGROUND OF THE INVENTION

1. Field of the Invention

The present invention relates to a non-volatile semiconductor memory and a fabricating method therefor, and more specifically to a non-volatile semiconductor memory having a word line backed or lined with an overlying conductor in order to reduce the resistance of the word line, and a method for forming the word line structure.

2. Description of Related Art

In a flash memory, it is a conventional practice that a word line is backed or lined with an overlying conductor in order to reduce the resistance of the word line. In many flash memories, since a high speed access was not required and since a bit line is formed of a first level interconnection layer, it was sufficient if the word line is backed or lined with an overlying interconnection formed of a second or further high level interconnection metal layer by electrically connecting the word line to the overlying interconnection through contacts which are provided at a rate of one contact per 512 or 1024 cells. Recently, however, with an increasing demand for a flash memory formed together with a microcomputer in a single chip, and therefore, with an increasing demand for the high speed access in the flash memory, it has become necessary to increase the frequency of backing or lining. Here, an example for connecting the word line to a first level metal interconnection through contacts provided at a rate of one contact per 16 or 32 cells, will be described with reference to FIGS. 1 to 3.

FIG. 1 is a diagrammatic plan view of a memory cell array in the flash memory after a first level metal interconnection is formed. For simplification, only two first level metal interconnections 601 are shown in FIG. 1. The first level metal interconnection 601 constitutes an interconnection for backing a word line 602 in the flash memory. The word line 602 is formed of polycide. The first level metal interconnection 601 for the backing is electrically connected to the word line 602 through pillar-shaped contacts 603, which are formed at a rate of one contact per 16 or 32 cells. Reference Number 604 designates one memory cell region in the flash memory. Actually, a number of memory cell regions are formed consecutively along each word line 602, but for simplification, only one memory cell region 604 is shown in the drawing. In addition, a space for the pillar-shaped contact 603 is provided one per 16 or 32 cells.

Referring to FIG. 2, there is shown a diagrammatic sectional view taken along the line I—I longitudinally passing both the first level metal interconnection 601 and the word line 602 in FIG. 1. FIG. 3 is a diagrammatic sectional view taken along the line J—J transversely passing on the pillar-shaped contact 603 in FIG. 1. A device isolation oxide film 701 is formed on a principal surface of a semiconductor substrate 700 so as to confine a number of device formation regions (memory cell regions). This device isolation oxide film 701 is formed of a thermal oxidation film ordinarily having a thickness on the order of 400 nm.

On the principal surface of a semiconductor substrate 700 within each device formation region, a tunnel oxide film 702 is formed for example by a thermal oxidation. This tunnel oxide film 702 ordinarily has a thickness of not greater than 10 nm. A floating gate 703 is formed on the tunnel oxide film 702. For example, this floating gate 703 is formed of a polysilicon film which has a thickness on the order of 150 nm and which is lightly doped with phosphorus. Each floating gate 703 is coated with an insulating film 704, which is ordinarily formed of a triple-layer structure of oxide film/nitride film/oxide film, having a film thickness of not greater than 20 nm converted into an oxide film thickness.

The word line 602 is formed on the insulating film 704 to continuously extend over a number of floating gates 703. Therefore, the word line 602 functions as a control gate located above the floating gate 703. The word line 602 has a polycide structure formed of an underlying phosphorus-doped polysilicon layer having a thickness on the order of 150 nm and an overlying tungsten silicide layer having a thickness on the order of 150 nm. An interlayer insulator film 705 is formed to cover the whole surface including the word line 602. The first level metal interconnection 601 is formed on the interlayer insulator film 705 to extend along the corresponding word line 602, and is electrically connected to the corresponding word line 602 through a plurality of pillar-shaped contacts 603 which are provided at the rate of one contact per 16 or 32 cells and which are formed to penetrate through the interlayer insulator film 705 to reach the word line 602. Ordinarily, the first level metal interconnection 601 is formed of a triple-layer structure of TiN/Al/TiN, and the pillar-shaped contact 603 is formed of tungsten.

In the above mentioned word line structure backed with the overlying interconnection layer, however, the reading speed of the flash memory could not have been satisfactorily elevated. The reason for this is that, since the word line is electrically connected to the backing metal interconnection by only the pillar-shaped contacts which are provided at the rate of one contact per 16 or 32 cells, the resistance of the word line cannot be sufficiently lowered. In this connection, if the number of the contacts were increased in order to reduce the resistance, an extra space for providing the increased number of contacts will become necessary, resulting in an increased chip area.

In order to overcome the above mentioned problem, the co-inventors of this application proposed a new word line structure in a co-pending application entitled "NON-VOLATILE SEMICONDUCTOR MEMORY DEVICE AND MANUFACTURING METHOD THEREOF", filed on Sep. 2, 1999 claiming the Convention priority based on Japanese Patent Application No. 250265/1998 filed Sep. 4, 1998, assigned to the assignee of this application.

In this proposed word line structure, a groove is formed in an interlayer insulator film covering the word line (gate electrode), to longitudinally extend along the word line and to penetrate through the interlayer insulator film so as to reach the word line, and a conducting material is filled into the groove to form an upstanding-plate-shaped contact, and an overlying interconnection is formed on the upstanding-plate-shaped contact (formed of the conducting material filled in the groove), so that the word line is electrically connected to the overlying interconnection at a large contacting area by the upstanding-plate-shaped contact, thereby to reduce the resistance of the word line.

The above mentioned proposal is satisfactory to some degree from the viewpoint of reducing the resistance of the word line. In other words, it is, in some cases, necessary to further reduce the resistance of the word line, depending upon the construction and a demanded performance of the non-volatile semiconductor memory, and depending upon the shape of the contact hole and the groove and a combination of the filled metal and the interconnection metal.

The above mentioned proposal is characterized in that the groove extending in the word line direction is formed at the same time as contact holes are formed in a peripheral circuit zone of a non-volatile semiconductor memory, and the same metal is filled into the contact holes and the groove to simultaneously form pillar-shaped contacts in the peripheral circuit zone and the upstanding-plate-shaped contact in a memory zone, respectively. Thereafter, the overlying interconnection formed of a material different from that of the upstanding-plate-shaped contact is deposited on the upstanding-plate-shaped contact. Therefore, since the conducting material of the upstanding-plate-shaped contact has a resistivity larger than that of the overlying interconnection, and since a contact resistance inevitably occurs at a boundary between the overlying interconnection and the upstanding-plate-shaped contact, the resistance of the word line cannot satisfactorily be reduced.

SUMMARY OF THE INVENTION

Accordingly, it is an object of the present invention to provide a non-volatile semiconductor memory which has overcome the above mentioned problem of the prior art.

Another object of the present invention is to provide a non-volatile semiconductor memory having a word line of a reduced resistance, thereby to shorten the reading time of the memory, and a method for fabricating the non-volatile semiconductor memory with requiring no complicated process.

The above and other objects of the present invention are achieved in accordance with the present invention by a non-volatile semiconductor memory comprising a peripheral circuit zone and a memory zone including a number of memory cells each having a floating gate and a control gate, an interlayer insulator film covering the control gate of the number of memory cells in the memory zone and a gate electrode formed in the peripheral circuit zone, a contact hole which is formed through the interlayer insulator film to reach the gate electrode formed in the peripheral circuit zone and which is filled with a first conducting material, and a groove which is formed in the interlayer insulator film to extend along a word line which constitutes the control gate of a plurality of memory cells arranged in one line, the groove penetrating through the interlayer insulator film to reach the control gate of the plurality of memory cells, the groove being filled with a second conducting material that is different from the first conducting material, so that a plate-shaped contact is formed in the groove.

According to a second aspect of the present invention, there is provided a semiconductor memory comprising a number of memory cells each including at least one memory cell transistor having a gate, an interlayer insulator film covering the gate of the at least one memory cell transistor of the number of memory cells, a groove which is formed in the interlayer insulator film to extend along a word line which constitutes the gate of a plurality of memory cell transistors arranged in one line, the groove penetrating through the interlayer insulator film to reach the gate of the plurality of memory cell transistors, the groove being filled with a conducting material so that a plate-shaped contact is formed in the groove, and an interconnection formed on the interlayer insulator film to extend on the plate-shaped contact over the whole length of the plate-shaped contact, so that the interconnection and the plate-shaped contact are electrically connected in parallel to each other over the whole length of the plate-shaped contact, the interconnection being formed of the same material as the conducting material.

According to a third aspect of the present invention, there is provided a non-volatile semiconductor memory comprising a peripheral circuit zone and a memory zone including a number of memory cells each having a floating gate and a control gate, an interlayer insulator film covering the control gate of the number of memory cells in the memory zone and a gate electrode formed in the peripheral circuit zone, a groove which is formed in the interlayer insulator film to extend along a word line which constitutes the control gate of a plurality of memory cells arranged in one line, the groove penetrating through the interlayer insulator film to reach the control gate of the plurality of memory cells, the groove being filled with a conducting material so that a plate-shaped contact is formed in the groove, and an interconnection formed on the interlayer insulator film to extend on the plate-shaped contact over the whole length of the plate-shaped contact, so that the interconnection and the plate-shaped contact are electrically connected in parallel to each other over the whole length of the plate-shaped contact, the interconnection being formed of the same material as the conducting material.

According to a fourth aspect of the present invention, there is provided a method for fabricating a non-volatile semiconductor memory having a peripheral circuit zone and a memory zone including a number of memory cells each having a floating gate and a control gate, the method including the steps of:

forming an interlayer insulator film to cover the control gate of the number of memory cells in the memory zone and a gate electrode formed in the peripheral circuit zone;

forming a contact hole penetrating through the interlayer insulator film to reach the gate electrode formed in the peripheral circuit zone;

filling a first conducting material into the contact hole;

forming in the interlayer insulator film a groove extending along a word line which constitutes the control gate of a plurality of memory cells arranged in one line, the groove penetrating through the interlayer insulator film to reach the word line;

depositing a second conducting material on the interlayer insulator film so as to fill the second conducting material into the groove, and patterning a layer of the second conducting material deposited on the interlayer insulator film so as to form a patterned interconnection which extends on the interlayer insulator film along the word line so that the patterned interconnection is electrically connected to the word line through a plate-shaped contact which is formed of the second conducting material filled into the groove and which extends over the whole length of the word line.

According to a fifth aspect of the present invention, there is provided a method for fabricating a non-volatile semiconductor memory having a peripheral circuit zone and a memory zone including a number of memory cells each having a floating gate and a control gate, the method including the steps of:

forming a first insulator film to cover the control gate of the number of memory cells in the memory zone and a gate electrode formed in the peripheral circuit zone;

selectively removing a predetermined region of the first insulator film to form a contact hole in the peripheral circuit zone;

filling a first conducting material into the contact hole to form a pillar-shaped contact;

forming a second insulator film covering the first insulator film and the contact, the second insulator film functioning as an etching stopper;

forming a third insulator film on the second insulator film so that a triple-layer interlayer insulator film is formed of the first insulator film, the second insulator film and the third insulator film;

selectively removing the third insulator film, the second insulator film and the first insulator film, to form in the triple-layer interlayer insulator film a groove extending along a word line which constitutes the control gate of a plurality of memory cells arranged in one line, the groove penetrating through the triple-layer interlayer insulator film to reach the word line; and depositing a second conducting material on the interlayer insulator film so as to fill the second conducting material into the groove, and removing the second conducting material deposited on the triple-layer interlayer insulator film, so that a patterned interconnection formed of the second conducting material is formed in the groove and is electrically connected to the word line over the whole length of the word line.

In one embodiment, the interlayer insulator film can be formed of a multi-layer insulator film of a BPSG (borophosphosilicate glass) film, a silicon nitride film and a silicon oxide film stacked in the named order. In addition, the first conducting material includes at least tungsten, and the second conducting material includes at least a metal selected from the group consisting of aluminum and copper.

With the above mentioned arrangement, the interconnection having a relatively small resistivity is electrically connected to the word line (control gate) at an increased contact area without complicating the fabricating process and without increasing the chip area. Thus, the wiring resistance of the word line functioning as the control gate of the plurality of memory cells can be reduced, so that the reading speed of the flash memory can be elevated.

In addition, since the interconnection formed on the interlayer insulator film and the plate-shaped contact filled in the groove are integrally formed of the same second conducting material, no contact resistance occurs between the interconnection and the plate-shaped contact. Furthermore, since the plate-shaped contact filled in the groove is formed of the same second conducting material as that constituting the interconnection having the relatively small resistivity, the whole resistance of the interconnection and the plate-shaped contact connected in parallel can be reduced.

The above and other objects, features and advantages of the present invention will be apparent from the following description of preferred embodiments of the invention with reference to the accompanying drawings.

BRIEF DESCRIPTION OF THE DRAWINGS

FIGS. 7A to 7E are diagrammatic sectional views of the flash memory for illustrating the method in accordance with the present invention for fabricating the first embodiment of the flash memory in accordance with the present invention.

DESCRIPTION OF THE PREFERRED EMBODIMENTS

Now, embodiments of the present invention will be described with reference to the accompanying drawings.

Embodiment 1

Figure 1:
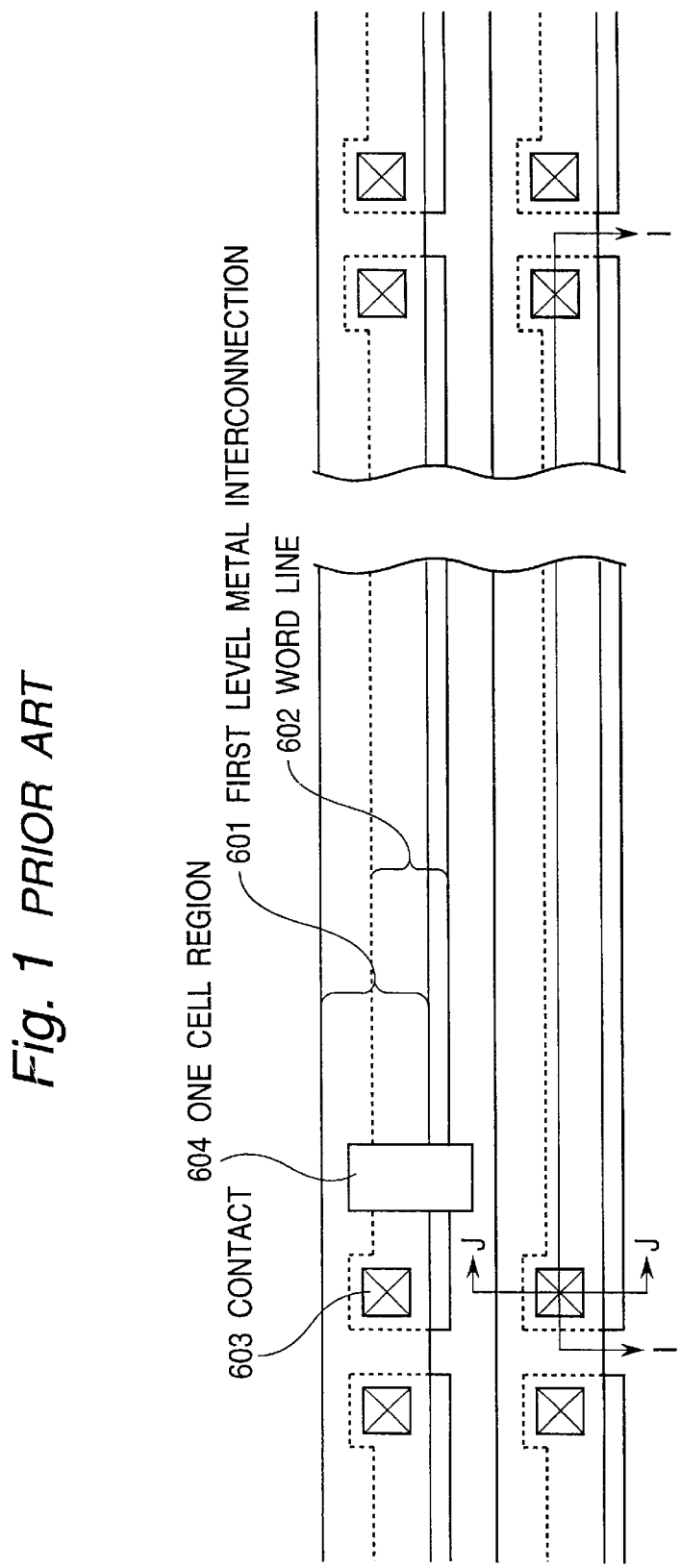
FIG. 1 is a diagrammatic plan view of a memory cell array in the prior art flash memory after a first level metal interconnection is formed.
Figure 2:
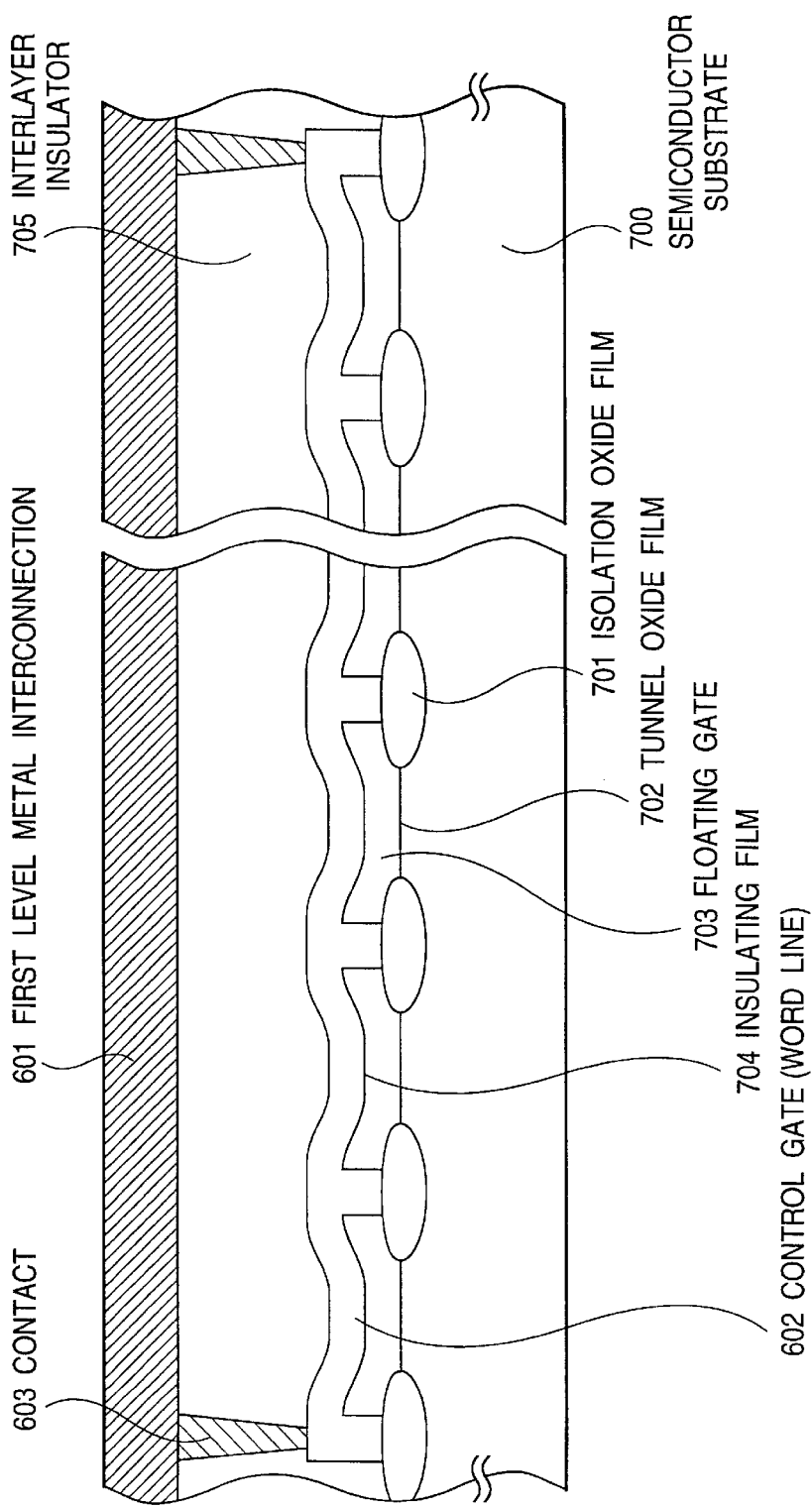
FIG. 2 is a diagrammatic sectional view taken along the line I—I in FIG. 1.
Figure 3:
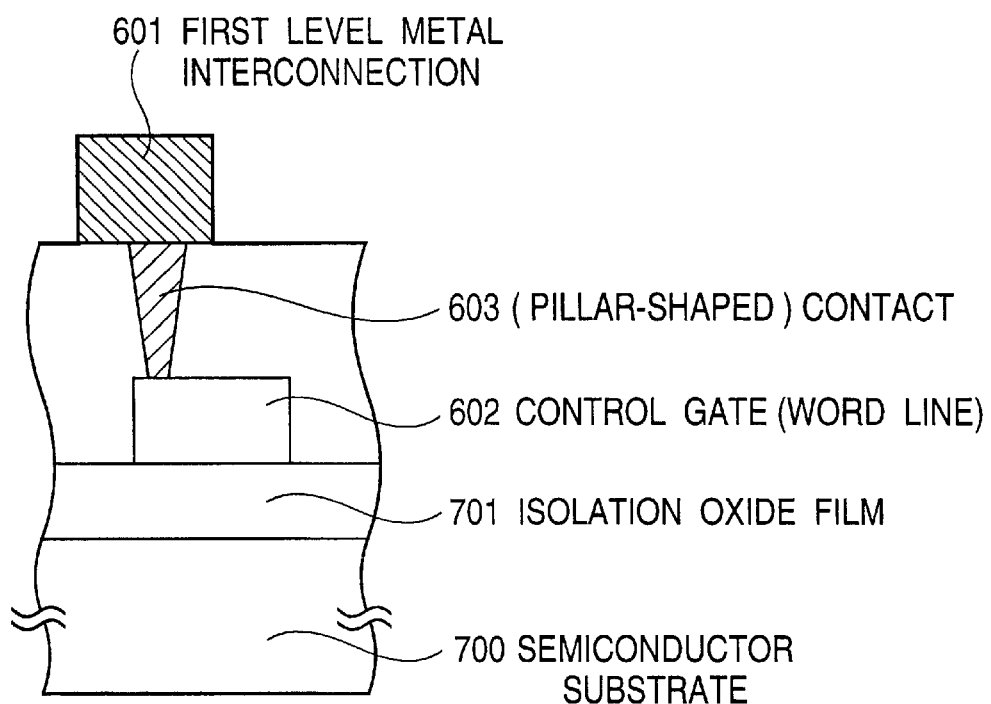
FIG. 3 is a diagrammatic sectional view taken along the line J—J in FIG. 1.
Figure 4:
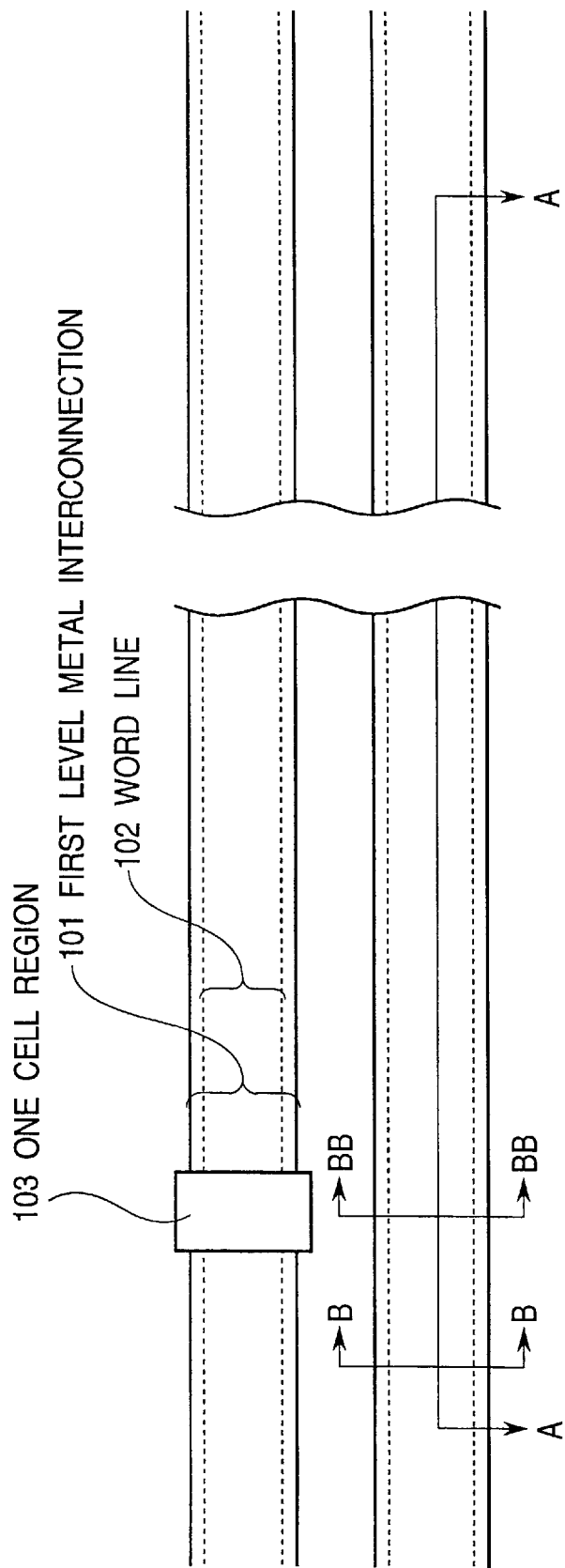
FIG. 4 is a diagrammatic plan view of a memory cell array in a first embodiment of the flash memory in accordance with the present invention after a first level metal interconnection is formed.

First, a first embodiment of the present invention will be described with reference to FIGS. 4 to 7E. FIG. 4 is a diagrammatic plan view of a memory cell array in a first embodiment of the flash memory in accordance with the present invention after a first level metal interconnection is formed.

For simplification, only two first level metal interconnections 101 are shown in FIG. 4. The first level metal interconnection 101 constitutes an interconnection for backing a word line 102 in the flash memory. The word line 102 is formed of polycide. The first level metal interconnection 101 for the backing is electrically connected to the word line 102 through an upstanding-plate-shaped contact which will be described hereinafter. Reference Number 103 designates one memory cell region in the flash memory. Actually, a number of memory cell regions are formed consecutively along each word line 102, but for simplification, only one memory cell region 103 is shown in the drawing. In this embodiment, no extra space for a conventional pillar-shaped contact interconnecting the word line 102 and the first level metal interconnection 101 for the backing is required.

Figure 5:
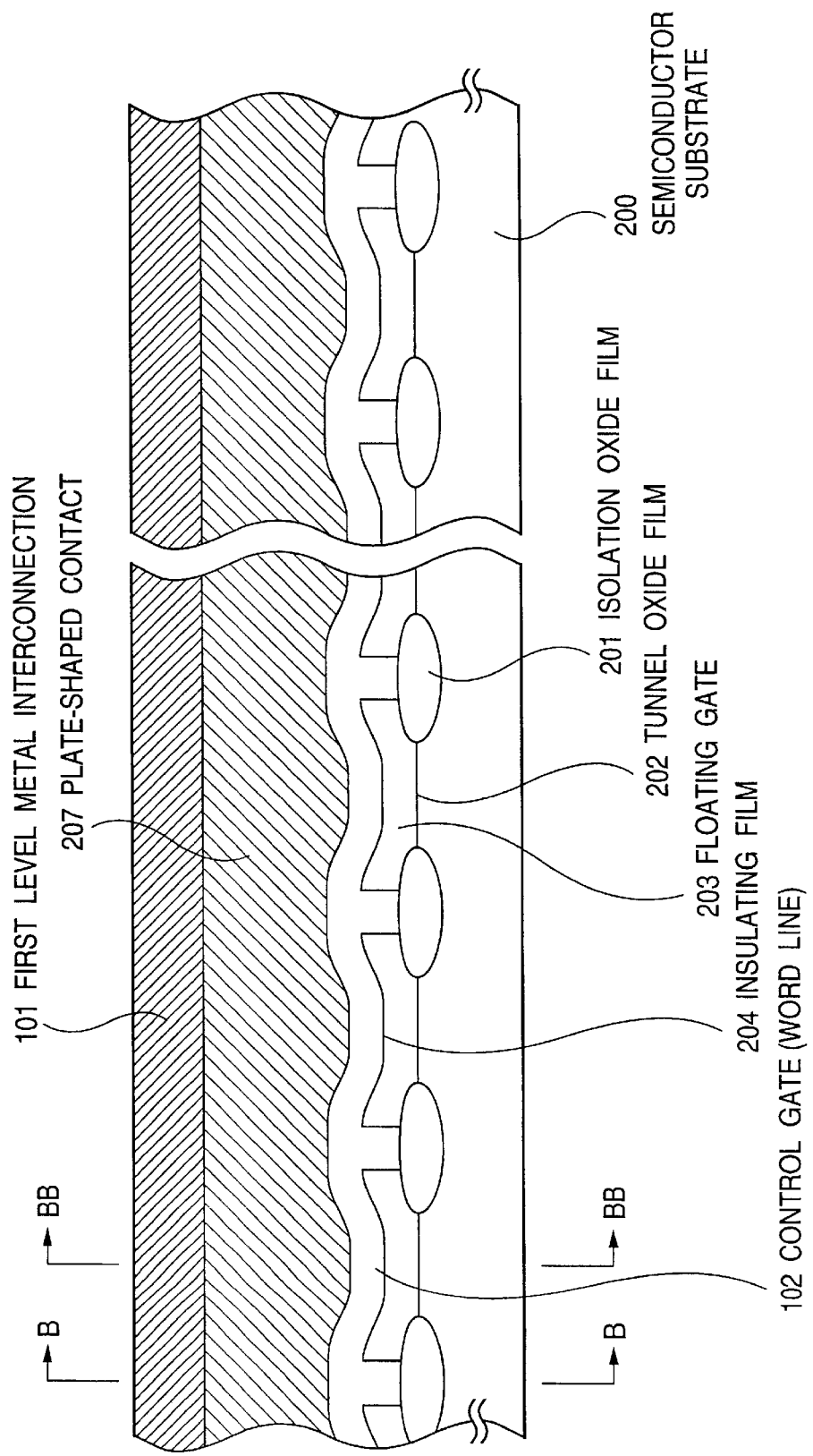
FIG. 5 is a diagrammatic sectional view taken along the line A—A in FIG. 4.
Figure 6:
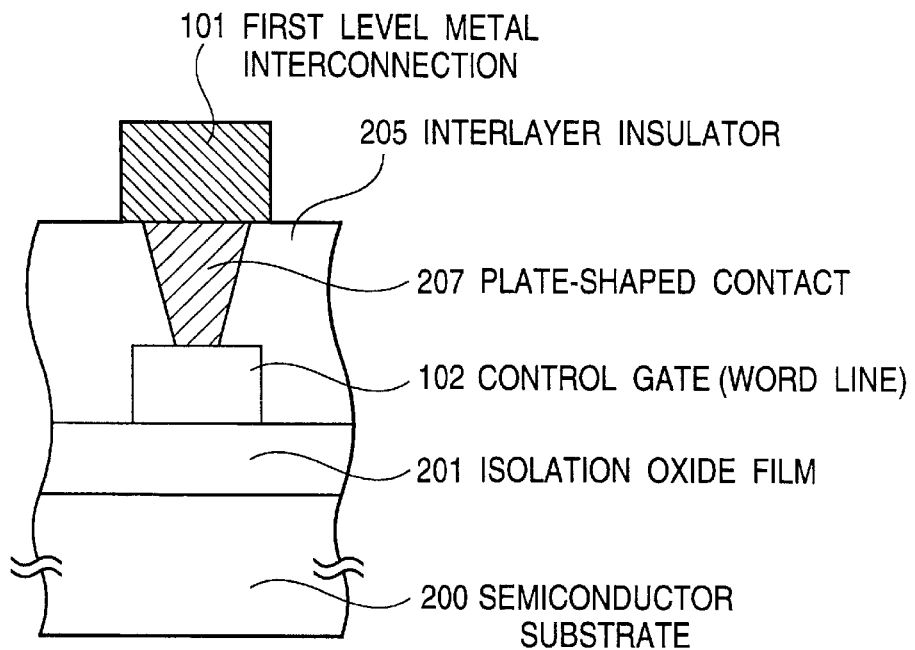
FIG. 6 is a diagrammatic sectional view taken along the line B—B in FIG. 4 and FIG. 5.

Referring to FIG. 5, there is shown a diagrammatic sectional view taken along the line A—A longitudinally passing on both the first level metal interconnection 101 and the word line 102 in FIG. 4. FIG. 6 is a diagrammatic sectional view taken along the line B—B crossing the first level metal interconnection 101 on a device isolation oxide film in FIG. 4 and FIG. 5, and FIG. 6A is a diagrammatic sectional view taken along the line BB—BB crossing the first level metal interconnection 101 in the memory cell region in FIG. 4 and FIG. 5.

A device isolation oxide film 201 is formed on a principal surface of a semiconductor substrate 200 so as to confine a number of device formation regions (memory cell regions). This device isolation oxide film 201 is formed of a thermal oxidation film ordinarily having a thickness on the order of 400 nm. On the principal surface of a semiconductor substrate 200 within each device formation region, a tunnel oxide film 202 is formed for example by a thermal oxidation. This tunnel oxide film 202 ordinarily has a thickness of not greater than 10 nm. A floating gate 203 is formed on the tunnel oxide film 202. For example, this floating gate 203 is formed of a polysilicon film which has a thickness on the order of 150 nm and which is lightly doped with phosphorus. Each floating gate 203 is coated with an insulating film 204, which is ordinarily formed of a triple-layer structure of oxide film/nitride film/oxide film, having a film thickness of not greater than 20 nm converted into an oxide film thickness.

The word line 102 is formed on the insulating film 204 to continuously extend over a number of floating gates 203 of a corresponding number of memory cells arranged in one line. Therefore, the word line 102 functions as a control gate at a position above each floating gate 203. The word line 102 has a polycide structure formed of an underlying phosphorus-doped polysilicon layer (102A in FIGS. 7A and 8A) having a thickness on the order of 150 nm and an overlying tungsten silicide layer (102B in FIGS. 7A and 8A) having a thickness on the order of 150 nm. For example, the underlying phosphorus-doped polysilicon layer can be formed by a conventional CVD (chemical vapor deposition process) and the overlying tungsten silicide layer can be formed by a conventional sputtering.

Figure 6A:
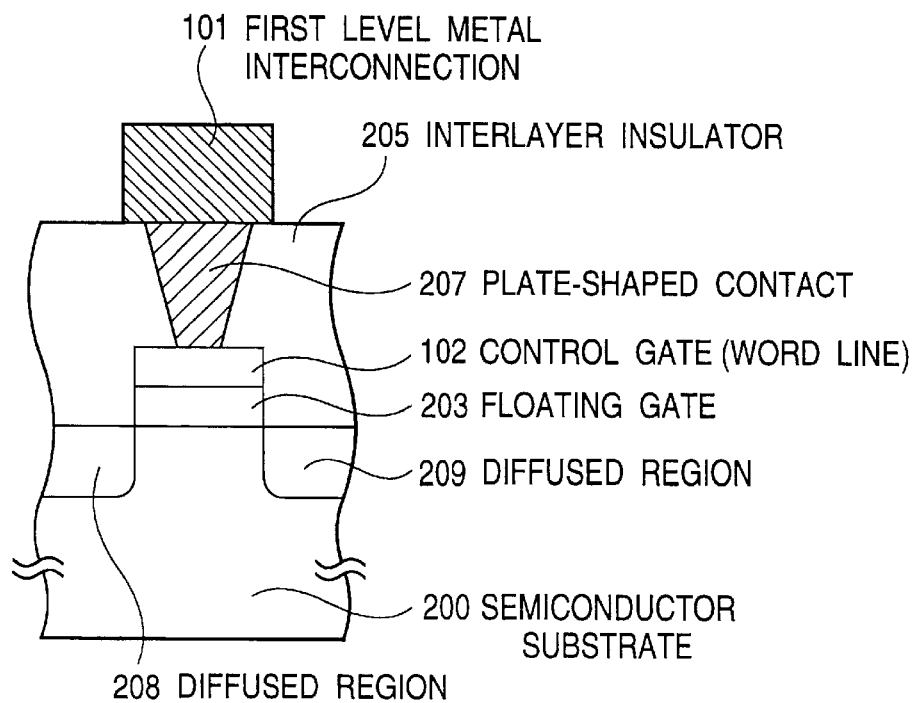
FIG. 6A is a diagrammatic sectional view taken along the line BB—BB in FIG. 4 and FIG. 5.

As shown in FIGS. 6 and 6A, an interlayer insulator film 205 is formed to cover the whole surface including the word line 102. The first level metal interconnection 101 is formed on the interlayer insulator film 205 to extend along the whole length of the corresponding word line 102, and is electrically connected to the corresponding word line 102 at its whole length through an upstanding-plate-shaped contact 207 which is formed to penetrate through the interlayer insulator film 205 to reach the word line 102. The upstanding-plate-shaped contact 207 is formed to extend along the word line 102 over the whole length of the word line 102, and has a bottom surface directly contacted with the word line 102 over the whole length of the upstanding-plate-shaped contact 207. As will be described hereinafter, the first level metal interconnection 101 and the plate-shaped contact 207 are integrally formed of a metal material having a low resistivity, for example, a triple-layer structure of TiN/Al/TiN. In other words, the upstanding-plate-shaped contact 207 is integral with the first level metal interconnection 101 over the whole length of the upstanding-plate-shaped contact 207.

As shown in FIG. 6A, in the principal surface of the semiconductor substrate 200 in each device formation region, a pair of diffused regions 208 and 209 are formed at opposite sides of the stacked assembly formed of the floating gate 203 and the control gate (word line) 102. One of the pair of diffused regions 208 and 209 functions as a source, and the other functions as a drain. Thus, one flash memory cell (memory cell transistor) is constituted.

Now, the method in accordance with the present invention for fabricating the first embodiment of the flash memory in accordance with the present invention, will be described with reference to FIGS. 7A to 7E. For simplification of description, the explanation will be started from a condition that memory cell transistors included in the flash memory and transistors included in a peripheral circuit have been formed, and an interlayer insulator film has been formed to cover those transistors and then planarized by suitable means such as a CMP (chemical mechanical polishing) process. In the diagrammatic sectional view of FIG. 7A, the reference character "C" designates a diffused layer region in a peripheral circuit zone, and the reference character "D" designates a gate region of a transistor included in the peripheral circuit zone. The reference character "E" designates a gate region in a memory zone. In FIGS. 7A to 7E, elements corresponding to those shown in FIGS. 4 to 6A are given the same reference numbers.

As shown in FIG. 7A, a diffused layer 401 formed in the principal surface of the semiconductor substrate 200 in the device formation region within the peripheral circuit zone, and a gate oxide film 402 is formed on the principal surface of the semiconductor substrate 200 in the device formation region within the peripheral circuit zone. This gate oxide film 402 is ordinarily formed by a thermal oxidation and has a film thickness on the order of not greater than 8 nm. However, if the gate oxide film 402 is a gate oxide film of a transistor sustaining a high breakdown voltage, the gate oxide film 402 has a film thickness on the order of not greater than 25 nm. A gate electrode 403 for a transistor in the peripheral circuit is formed on the gate oxide film 402 and is surrounded by a side wall insulator.

In the memory zone, the tunnel oxide film 202 is formed on the principal surface of the semiconductor substrate 200, and the floating gate 203 is formed on the tunnel oxide film 202. The insulator film 204 is formed on the floating gate 203, and the control gate (word line) 102 is formed on the insulator film 204. The floating gate 203 and the control gate (word line) 102 are surrounded by a side wall insulator. In addition, since the gate electrode 403 and the control gate (word line) 102 are simultaneously formed in the same process, the gate electrode 403 has the same polycide structure as that of the control gate (word line) 102 mentioned hereinbefore. Namely, the gate electrode 403 is formed of an underlying phosphorus-doped polysilicon layer 403A having a thickness on the order of 150 nm and an overlying tungsten silicide layer 403B having a thickness on the order of 150 nm.

The interlayer insulator film 205 is formed to cover the whole surface including the diffused layer 401, the gate electrode 403 and the control gate (word line) 102. This interlayer insulator film 205 is formed by depositing for example a BPSG on the whole surface, and then planarizing the deposited BPSG film by the CMP process so that the planarized BPSG film has a film thickness on the order of 800 nm. Thereafter, with a conventional lithographic process and a conventional etching process, a contact hole 405 reaching the diffused layer 401 and a contact hole 406 reaching the gate electrode 403 are formed in the interlayer insulator film 205, as shown in FIG. 7A. In this step, a groove for the upstanding-plate-shaped contact 207 has not yet been formed.

Thereafter, a barrier metal, for example, Ti/TiN, is deposited on an inner surface of these contact holes 405 and 406 by a sputtering, and a metal, for example, tungsten, is filled into the contact holes 405 and 406 by the CVD process. Furthermore, the CMP process or an etch-back process is carried out so that the surface of the interlayer insulator film 205 is exposed. Thus, contacts 407 formed of the metal filled into the contact holes 405 and 406 are formed as shown in FIG. 7B.

Figure 7C:
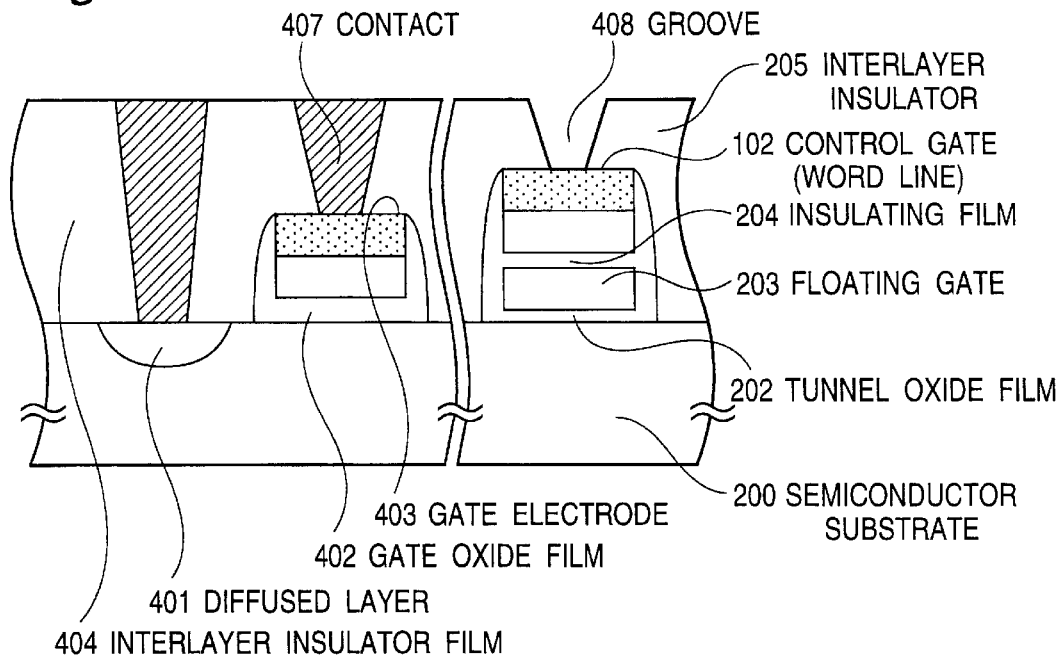

Thereafter, with a conventional lithographic process and a conventional etching process, a groove 408 reaching the control gate (word line) 102 is formed in the interlayer insulator film 205, as shown in FIG. 7C. This groove 408 is different from the conventional cylindrical contact hole, but has a shape extending over the whole length of the control gate (word line) 102, so as to enable to form the upstanding-plate-shaped contact 207 as shown in FIG. 5.

Figure 7D:
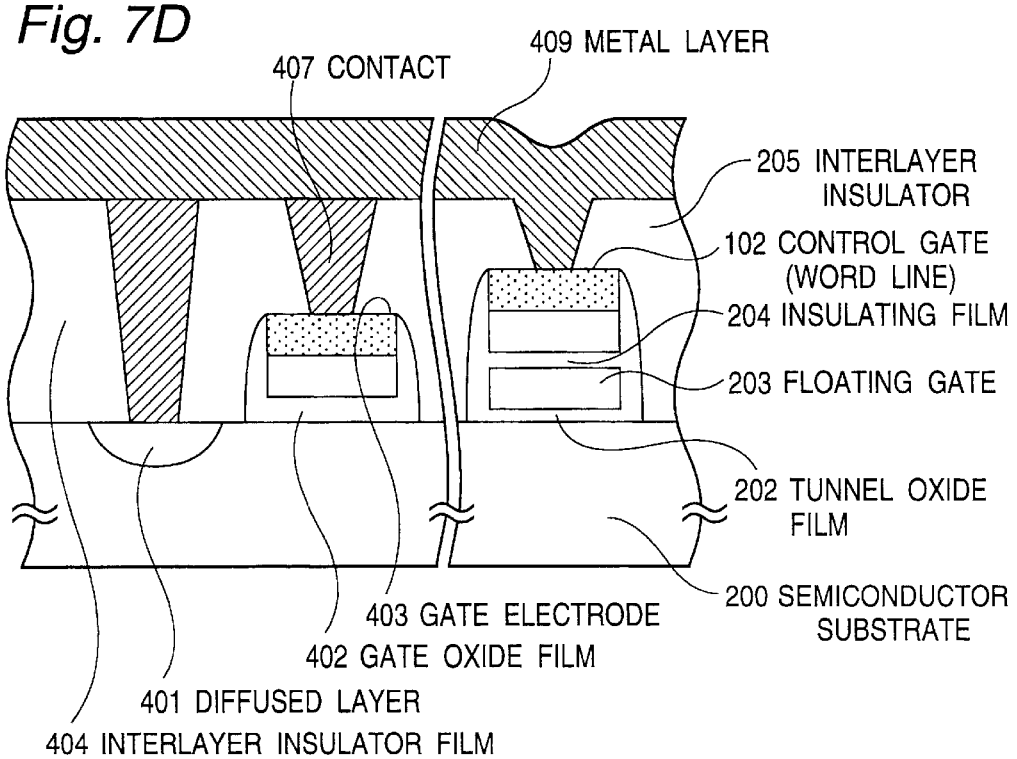
Figure 7E:
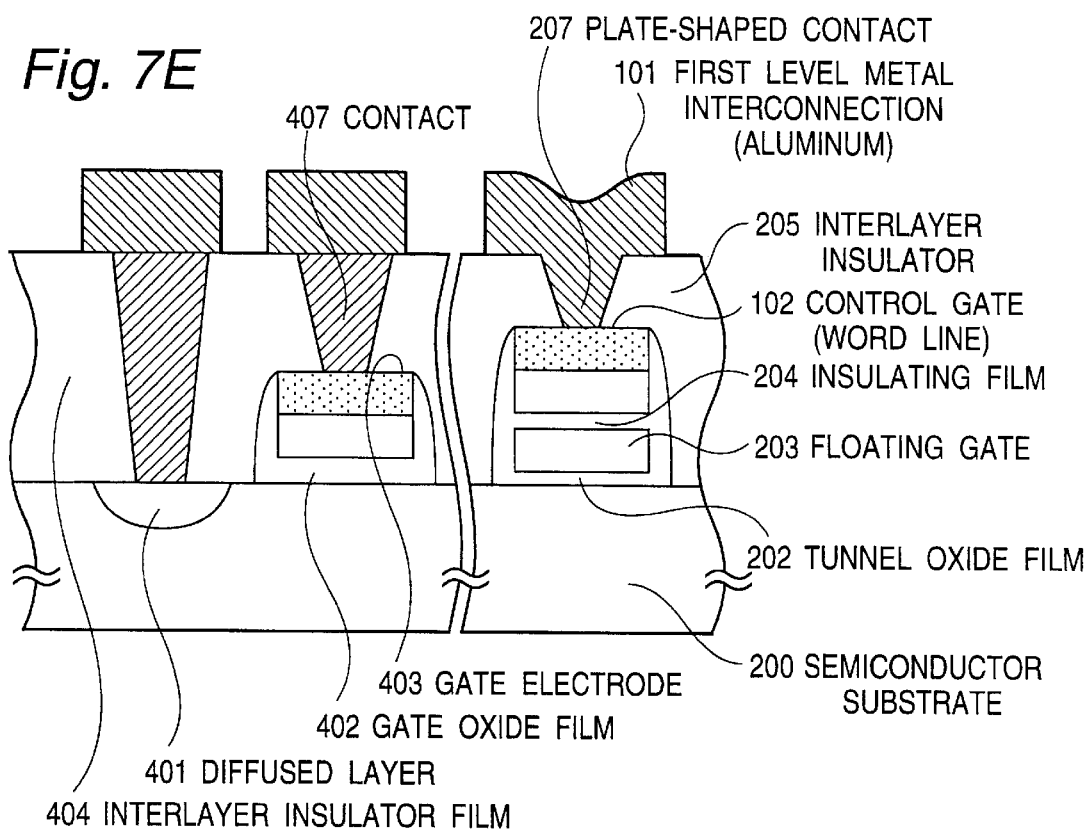

As shown in FIG. 7D, deposition of the first level metal interconnection and the filling-up of the groove 408 are simultaneously executed. For this purpose, for example, Ti/Al/Ti having the film thickness of 50 nm/500 nm/50 nm, respectively, is deposited on the whole surface by a sputtering, and then, a reflow is executed at a temperature of about 450° C. Particularly, since the control gate of the memory cells in the memory zone is positioned at a level higher than that of the gate electrode in the peripheral circuit zone by the height of the floating gate, the aspect ratio of the groove 408 is smaller than that of the contact hole reaching the gate electrode in the peripheral circuit zone. Therefore, the groove 408 can be easily filled with the deposited metal, in comparison with the filling-up of the contact hole in the peripheral circuit zone. Thereafter, the deposited metal layer 409 is patterned with a conventional lithographic process and a conventional etching process, so that the first level metal interconnection 101 formed of aluminum is formed on the interlayer insulator film 205.

Incidentally, the materials used in this embodiment are not limited to only those mentioned above. In particular, the metal filled in the contact groove 408, namely, the metal 409 for the first level metal interconnection 101 is not limited to only aluminum, and it is sufficient if it is a low resistivity metal. For example, copper can be used in place of the aluminum. Under the current integrated circuit fabricating technology, the metal used for forming the interconnection ordinarily has a resistivity smaller than that of the metal used for forming the contact. Currently, tungsten is often used for forming the contact, and aluminum and copper is often used for forming the interconnection. The aluminum and the copper have a resistivity smaller than that of the tungsten.

In the above mentioned first embodiment, since the word line 102 functioning as the control gate and the first level metal interconnection 101 formed on the interlayer insulator film 205 are electrically connected to each other by means of the plate-shaped contact 207 having a large contact area to both the word line 102 and the first level metal interconnection 101, it is possible to reduce the resistance of the word line 102. In addition, since in the same process the metal filled in the groove 408 for forming the upstanding-plate-shaped contact 207 is formed of the metal 409 having a low resistivity, which is used for forming the first level metal interconnection 101, the resistance of the plate-shaped contact 207 can be reduced without complicating the fabricating process, and further, no boundary is formed between the upstanding-plate-shaped contact 207 and the first level metal interconnection 101, so that no contact resistance occurs between the upstanding-plate-shaped contact 207 and the first level metal interconnection 101. Therefore, the resistance of the word line 102 can be further reduced for these two reasons.

Embodiment 2

Now, a second embodiment of the present invention will be described with reference to FIGS. 8A to 8F which are diagrammatic sectional views of the flash memory for illustrating the method in accordance with the present invention for fabricating the second embodiment of the flash memory in accordance with the present invention.

This second embodiment is different from the first embodiment in that the device surface is planarized after the first level interconnection is formed. Similarly to the explanation of the first embodiment, for simplification of description, the explanation will be started from the condition that the memory cell transistors included in the flash memory and the transistors included in the peripheral circuit have been formed, and the interlayer insulator film has been formed to cover those transistors and then planarized by suitable means such as a CMP process. In the diagrammatic sectional view of FIG. 8A, the reference character "F" designates a diffused layer region in the peripheral circuit zone, and the reference character "G" designates a gate region of a transistor included in the peripheral circuit zone. The reference character "H" designates a gate region in a memory zone. In FIGS. 8A to 8F, elements corresponding to those shown in FIGS. 4 to 6A are given the same reference numbers.

Figure 8A:
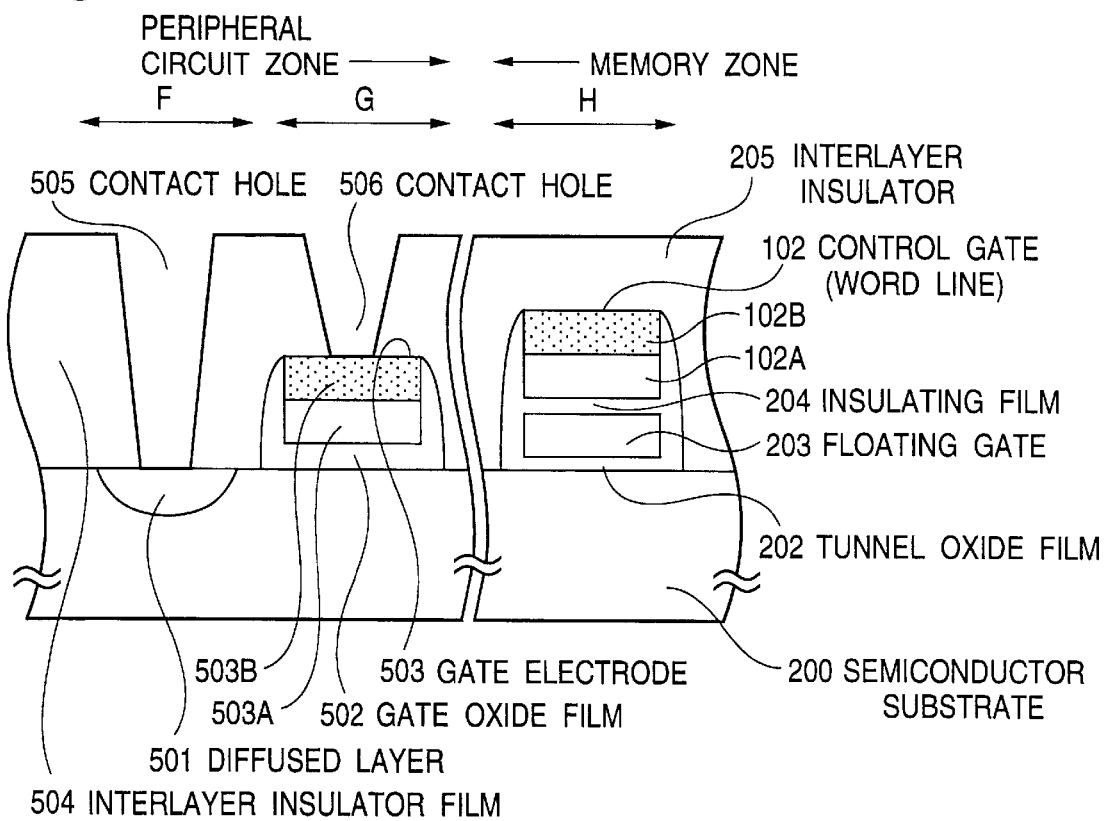
FIGS. 8A to 8F are diagrammatic sectional views of the flash memory for illustrating the method in accordance with the present invention for fabricating a second embodiment of the flash memory in accordance with the present invention.

As shown in FIG. 8A, a diffused layer 501 formed in the principal surface of the semiconductor substrate 200 in the device formation region within the peripheral circuit zone, and a gate oxide film 502 is formed on the principal surface of the semiconductor substrate 200 in the device formation region within the peripheral circuit zone. This gate oxide film 502 is ordinarily formed by a thermal oxidation and has a film thickness on the order of not greater than 8 nm. However, if the gate oxide film 502 is a gate oxide film of a transistor sustaining a high breakdown voltage, the gate oxide film 502 has a film thickness on the order of not greater than 25 nm. A gate electrode 503 for a transistor in the peripheral circuit is formed on the gate oxide film 502 and is surrounded by a side wall insulator.

In the memory zone, the tunnel oxide film 202 is formed on the principal surface of the semiconductor substrate 200, and the floating gate 203 is formed on the tunnel oxide film 202. The insulator film 204 is formed on the floating gate 203, and the control gate (word line) 102 is formed on the insulator film 204. The floating gate 203 and the control gate (word line) 102 are surrounded by a side wall insulator. In addition, since the gate electrode 503 and the control gate (word line) 102 are simultaneously formed in the same process, the gate electrode 503 has the same polycide structure as that of the control gate (word line) 102 mentioned hereinbefore. Namely, the gate electrode 503 is formed of an underlying phosphorus-doped polysilicon layer 503A having a thickness on the order of 150 nm and an overlying tungsten silicide layer 503B having a thickness on the order of 150 nm.

The interlayer insulator film 205 is formed to cover the whole surface including the diffused layer 501, the gate electrode 503 and the control gate (word line) 102. This interlayer insulator film 205 is formed by depositing for example a BPSG on the whole surface, and then planarizing the deposited BPSG film by the CMP process so that the planarized BPSG film has a film thickness on the order of 800 nm.

Thereafter, with a conventional lithographic process and a conventional etching process, a contact hole 505 reaching the diffused layer 501 and a contact hole 506 reaching the gate electrode 503 are formed in the interlayer insulator film 205, as shown in FIG. 8A. In this step, a groove for the upstanding-plate-shaped contact 207 has not yet been formed.

Figure 8B:
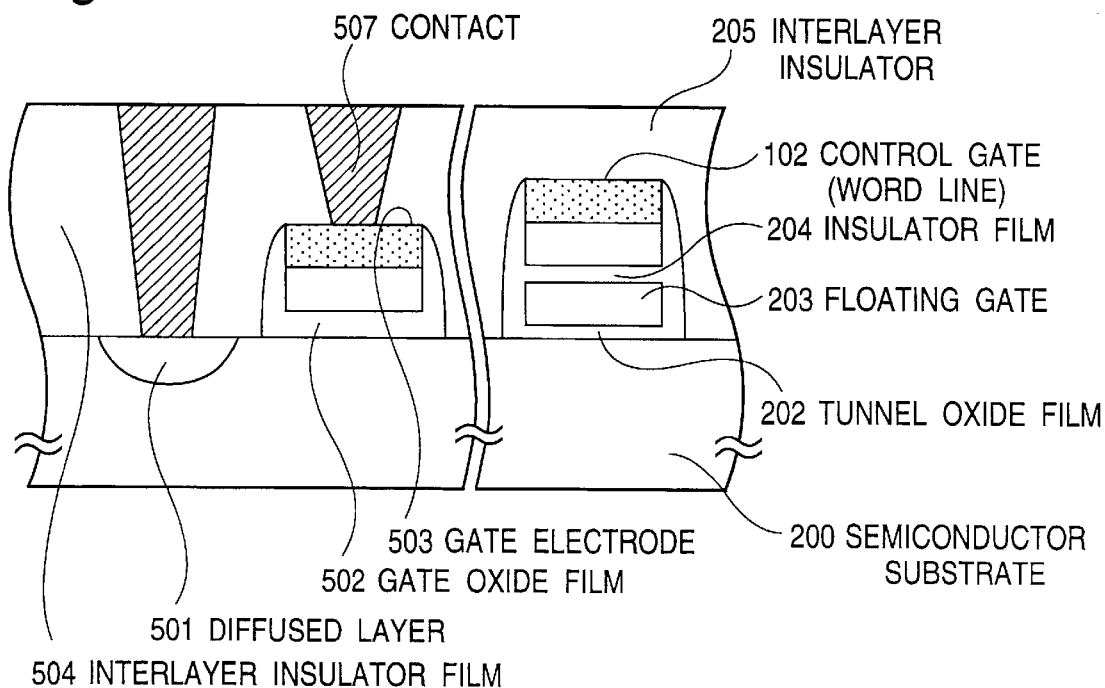

Thereafter, a barrier metal, for example, Ti/TiN, is deposited on an inner surface of these contact holes 505 and 506 by a sputtering, and a metal, for example, tungsten, is filled into the contact holes 505 and 506 by the CVD process. Furthermore, the CMP process or an etch-back process is carried out so that the surface of the interlayer insulator film 205 is exposed. Thus, contacts 507 formed of the metal filled into the contact holes 505 and 506 are formed as shown in FIG. 8B.

Then, a silicon nitride film 508 having a film thickness on the order of 80 nm is deposited on the whole surface by the CVD process, and succeedingly, a silicon oxide film 509 having a film thickness on the order of 500 nm is deposited on the silicon nitride film 508 by a plasma CVD process.

Therefore, a triple-layer interlayer insulator is constituted of the BPSG film 205, the silicon nitride film 508 and the silicon oxide film 509.

Figure 8C:
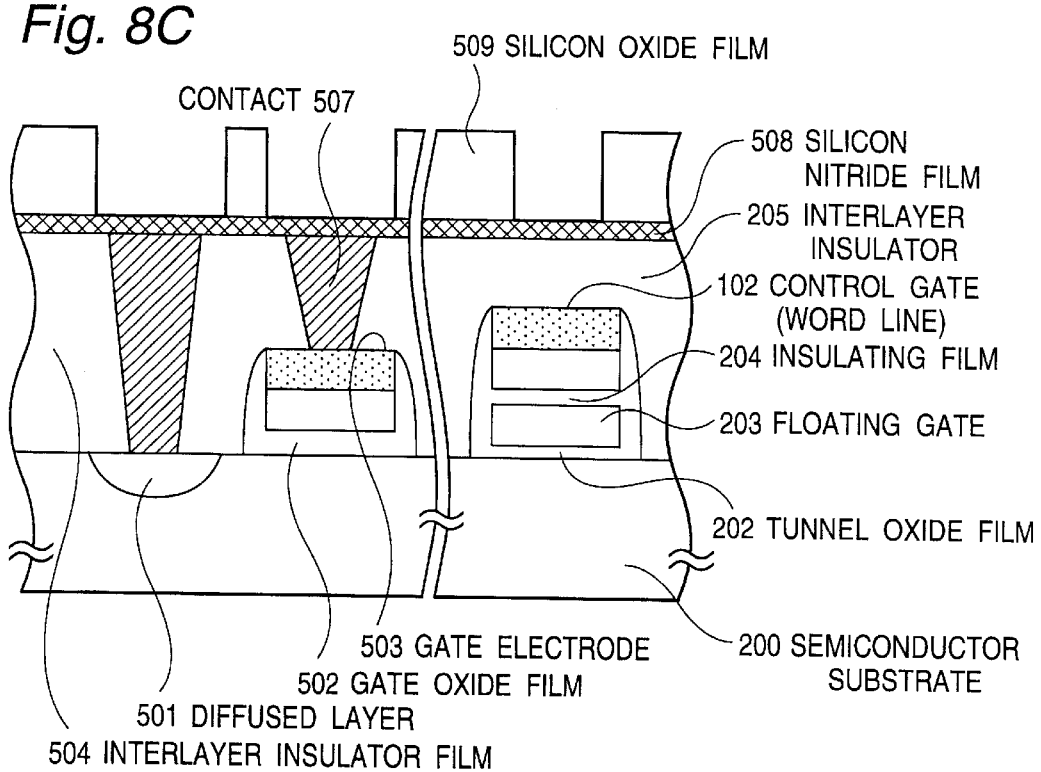

Succeedingly, with a conventional lithographic process and a conventional etching process, as shown in FIG. 8C, the silicon oxide film 509 is selectively removed from regions where the first level metal interconnection is to be formed. In this process, the silicon nitride film 508 functions as an etching stopper.

Figure 8D:
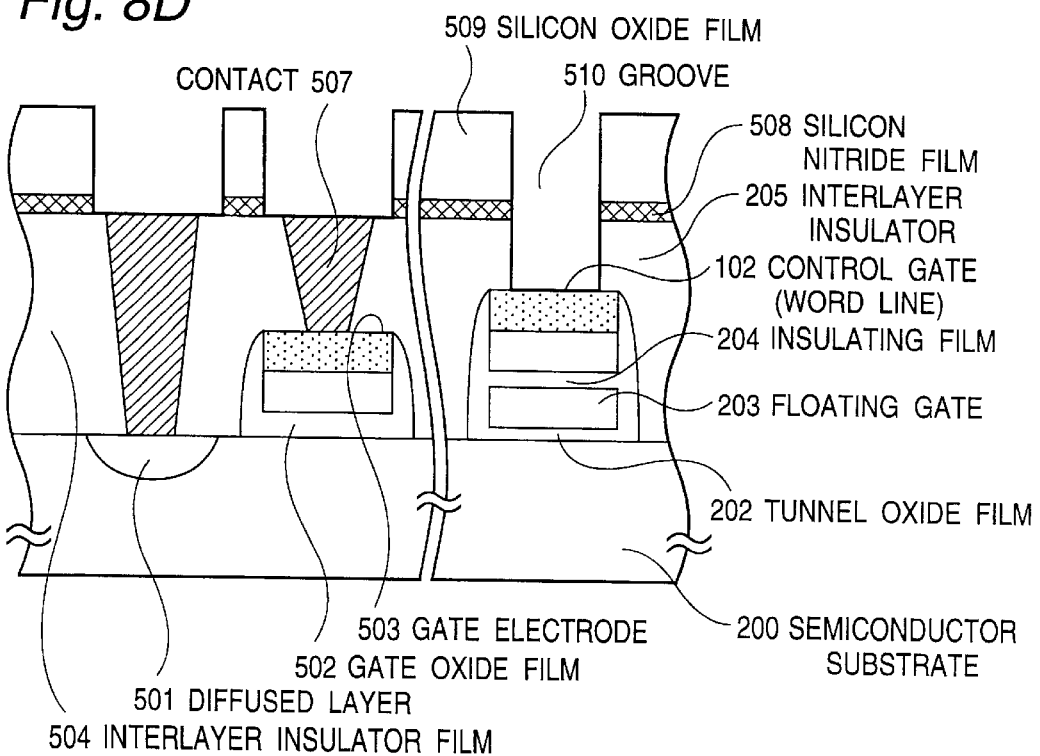

Furthermore, as shown in FIG. 8D, with a conventional lithographic process and a conventional etching process, the silicon nitride film 508 is selectively removed, and a groove 510 reaching the control gate (word line) 102 is formed in the interlayer insulator film 205. This groove 510 is different from the conventional cylindrical contact hole, but has a shape extending over the whole length of the control gate (word line) 102, so as to enable to form the upstanding plate-shaped contact 207 as shown in FIG. 5.

Figure 8E:
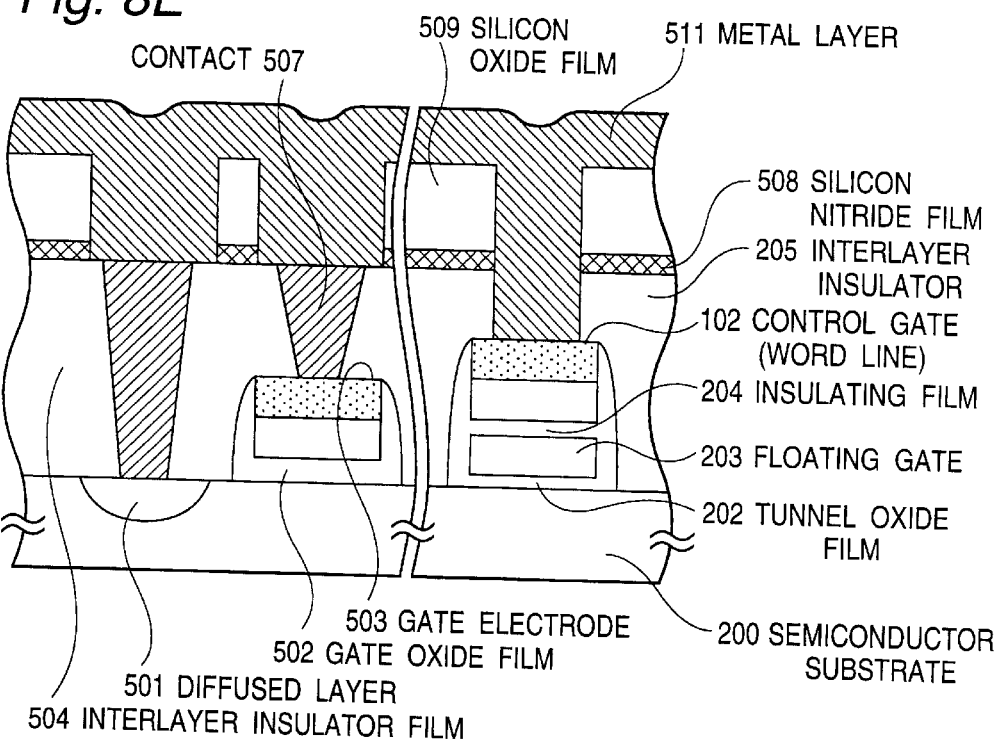

As shown in FIG. 8E, deposition of the first level metal interconnection and the filling-up of the groove 510 are simultaneously executed. For this purpose, for example, Ti/Al having the film thickness of 50 nm/500 nm, respectively, is deposited on the whole surface by a sputtering, and then, a reflow is executed at a temperature of about 450° C. Thus, a metal layer 511 is formed on the triple-layer interlayer insulator and to fill up the groove 510.

Figure 8F:
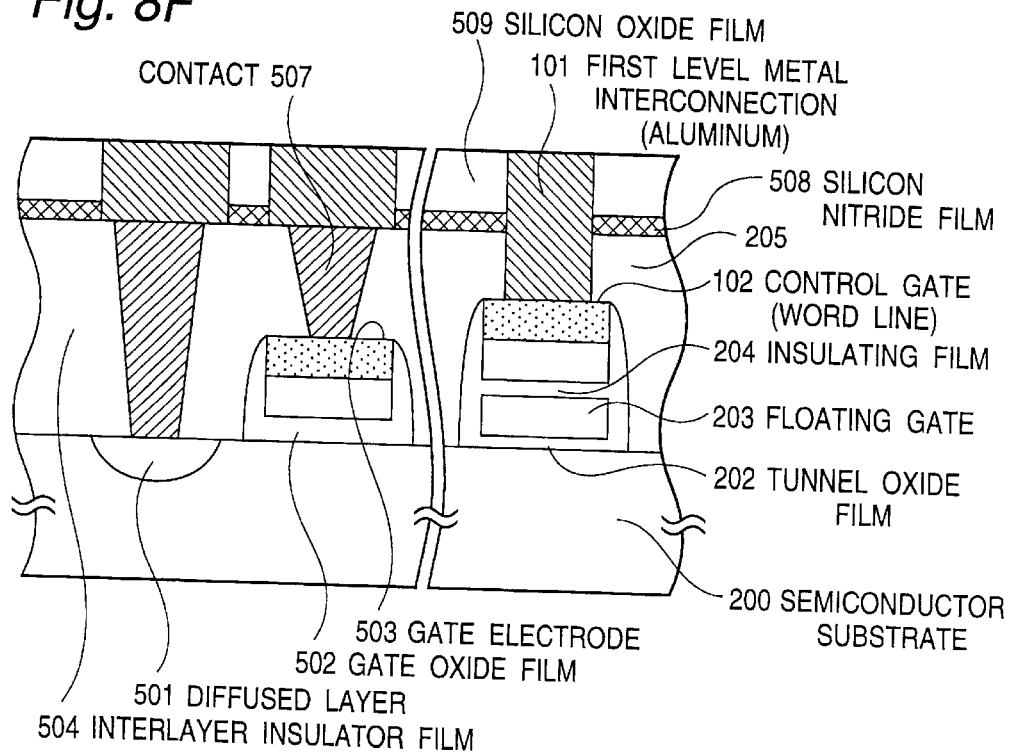

Thereafter, as shown in FIG. 8F, the surface is polished by the CMP process, so that there is formed the first level metal interconnection 101 formed of aluminum and embedded in the interlayer insulator film 205 so as to have a top surface planar with the top surface of the triple-layer interlayer insulator.

Incidentally, the materials used in this embodiment are not limited to only those mentioned above, similarly to the first embodiment. In particular, the metal filled in the contact groove 510, namely, the metal 511 of the first level metal interconnection 101 is not limited to only aluminum, and it is sufficient if it is a low resistivity metal. For example, copper can be used in place of the aluminum.

Accordingly, the resistance of the word line 102 can be reduced in this second embodiment, similarly to the first embodiment.

As seen from the above, according to the present invention, it is possible to reduce the resistance of the word line, so that the reading time of the flash memory can be shortened.

The reason for this is that: When the word line (formed of for example the polycide) is backed with the metal interconnection, the contact area between the word line and the metal interconnection which are electrically connected to each other through the upstanding-plate-shaped contact, is remarkably larger than that in the prior art in which the word line and the metal interconnection are electrically connected to each other through pillar-shaped contacts.

In addition, since the upstanding-plate-shaped contact is formed of the metal having a low resistivity, which is used for forming the metal interconnection, the resistance of the upstanding-plate-shaped contact itself can be reduced. Furthermore, since the groove is filled up in the same process as the metal used for forming the metal interconnection is deposited, and by the same material as the metal used for forming the metal interconnection, no boundary is formed between the upstanding-plate-shaped contact and the metal interconnection, so that no contact resistance occurs between the upstanding-plate-shaped contact and the metal interconnection. For these two reasons, the resistance of the word line can be further reduced without complicating the fabricating process.

Therefore, the present invention is very advantageous in particular in the case that a microcomputer and a flash memory are integrated together in a single chip, because a high speed access is required by the microcomputer.

However, it would be apparent to persons skilled in the art that since all semiconductor memories includes word lines, the present invention is in no way limited to only the non-volatile semiconductor memory typified by the flash memory, but can be applied to all the semiconductor memories including a DRAM, an SRAM and a mask RAM. In these cases, the word line of the semiconductor memory is backed with the overlying interconnection by the plate-shaped contact in accordance with the present invention.

In other words, the semiconductor memory such as a DRAM, an SRAM and a mask RAM comprises a number of memory cells, each including a memory transistor or transistors each having a gate. An interlayer insulator film is formed to cover the gate of the number of memory cell transistors. In accordance with the present invention, a groove is formed in the interlayer insulator film to extend along a word line which constitutes the gate of a plurality of memory cell transistors arranged in one line, the groove penetrating through the interlayer insulator film to reach the gate of the plurality of memory cell transistors. The groove is filled with a conducting material so that a plate-shaped contact is formed in the groove. An interconnection formed of the same material as the conducting material is formed on the interlayer insulator film to extend on the plate-shaped contact over the whole length of the plate-shaped contact, so that the interconnection and the plate-shaped contact are electrically connected in parallel to each other over the whole length of the plate-shaped contact.

The invention has thus been shown and described with reference to the specific embodiments. However, it should be noted that the present invention is in no way limited to the details of the illustrated structures but changes and modifications may be made within the scope of the appended claims.

What is claimed is:

1. A non-volatile semiconductor memory, comprising:
   a memory zone having plural memory cells therein that are arranged in a line;
   a word line that extends in a line over said line of plural memory cells and that is a gate for said plural memory cells;
   an interlayer insulator over said word line, said interlayer insulator having a linearly extended groove therein that is aligned with said word line and that reaches said word line throughout a length thereof that is over said line of plural memory cells; and
   a first conducting material to form a plate-shaped contact in said groove that contacts said word line throughout the length thereof that is over said line of plural memory cells, said first conducting material extending above said groove as a linear interconnect that is aligned with said word line throughout the length thereof that is over said line of plural memory cells.

2. The memory of claim 1, wherein said first conducting material comprises one of copper and aluminum.

3. The memory of claim 1, further comprising a peripheral circuit zone having a gate electrode for a peripheral transistor therein, said interlayer insulator extending over said peripheral zone and having a contact hole therein that extends to said gate electrode, said contact hole having a second conducting material therein that contacts said gate electrode, said first conducting material having a resistivity less than said second conducting material.

4. The memory of claim 3, wherein said first conducting material comprises one of copper and aluminum and said second conducting material comprises tungsten.

5. A non-volatile semiconductor memory, comprising:
- a peripheral circuit zone having a gate electrode for a peripheral transistor therein;
- a memory zone having plural memory cell transistors therein that are arranged in a line, each of said plural memory cell transistors having a floating gate and a control gate;
- a word line that extends in a line over said line of plural memory cell transistors and that is said control gate for said plural memory cell transistors;
- an interlayer insulator over said word line and over said gate electrode, said interlayer insulator having a linearly extended groove therein that is aligned with said word line and that reaches said word line throughout a length thereof that is over said line of plural memory cell transistors, said interlayer insulator having a contact hole therein that extends to said gate electrode;
- a first conducting material to form a plate-shaped contact in said groove that contacts said word line throughout the length thereof that is over said line of plural memory cells; and
- a second conducting material in said contact hole that contacts said gate electrode.

6. The memory of claim 5, wherein said first conducting material extends above said groove as a linear interconnect that is aligned with said word line throughout the length thereof that is over said line of plural memory cell transistors.

7. The memory of claim 5, wherein said first conducting material has a resistivity less than said second conducting material.

8. The memory of claim 7, wherein said first conducting material comprises one of copper and aluminum and said second conducting material comprises tungsten.

* * * * *